United States Patent
Mohseni et al.

(10) Patent No.: US 12,185,645 B2
(45) Date of Patent: Dec. 31, 2024

(54) MEMRISTOR DEVICES EMBEDDED IN DIELECTRICS

(71) Applicant: Northwestern University, Evanston, IL (US)

(72) Inventors: Hooman Mohseni, Wilmette, IL (US); Simone Bianconi, Evanston, IL (US)

(73) Assignee: Northwestern University, Evanston, IL (US)

( * ) Notice: Subject to any disclaimer, the term of this patent is extended or adjusted under 35 U.S.C. 154(b) by 500 days.

(21) Appl. No.: 17/687,968

(22) Filed: Mar. 7, 2022

(65) Prior Publication Data

US 2022/0285616 A1 Sep. 8, 2022

Related U.S. Application Data

(60) Provisional application No. 63/158,068, filed on Mar. 8, 2021.

(51) Int. Cl.
H10N 70/00 (2023.01)

(52) U.S. Cl.
CPC ......... H10N 70/826 (2023.02); H10N 70/011 (2023.02); *H10N 70/883* (2023.02)

(58) Field of Classification Search
CPC ..................................................... H10N 70/00
See application file for complete search history.

(56) References Cited

U.S. PATENT DOCUMENTS

| | | |
|---|---|---|
| 6,670,717 B2 | 12/2003 | Kane et al. |
| 7,763,552 B2 | 7/2010 | Tong et al. |
| 7,948,051 B2 | 5/2011 | Colburn et al. |
| 7,960,775 B2 | 6/2011 | Courtade et al. |
| 8,222,696 B2 | 6/2012 | Yamazaki et al. |
| 8,236,680 B2 | 8/2012 | Marks et al. |
| 8,377,722 B2 | 2/2013 | Goulet et al. |
| 2009/0163014 A1 | 6/2009 | Lee et al. |
| 2011/0291284 A1 | 12/2011 | Goldfarb et al. |
| 2022/0020635 A1 | 1/2022 | Mohseni et al. |

OTHER PUBLICATIONS

Simone Bianconi et al., "Giant Conductivity Modulation of Aluminum Oxide using Focused Ion Beam," *ArXiv*, Feb. 20, 2019; pp. 1-8.
N. E. Sosa, J. Liu, C. Chen, T. J. Marks, M. C. Hersam, "Nanoscale Writing of Transparent Conducting Oxide Features with a Focused Ion Beam," *Advanced Materials*, 2009, vol. 21, pp. 721-725.

(Continued)

*Primary Examiner* — Marvin Payen
(74) *Attorney, Agent, or Firm* — Bell & Manning, LLC

(57) ABSTRACT

Memristor devices are provided. In an embodiment, a memristor device comprises a top electrode; a bottom electrode; a dielectric material between the top and bottom electrodes; and an ion-implanted conductive region embedded within the dielectric material, the ion-implanted conductive region comprising the dielectric material. The ion-implanted conductive region forms an interface with the dielectric material such that a voltage applied across the top and bottom electrodes causes electrons to cross the interface as they move between the top and bottom electrodes so that the memristor device exhibits memristance.

20 Claims, 8 Drawing Sheets

(56) References Cited

OTHER PUBLICATIONS

N. E. Sosa, C. Chen, J. Liu, S. Xie, T. J. Marks, M. C. Hersam, "Nanoscale Structure, Composition, and Charge Transport Analysis of Transparent Conducting Oxide Nanowires Written by Focused Ion Beam Implantation," *Journal of American Chemical Society*, 2010, vol. 132, pp. 7347-7354.
Junfeng Wang et al., "Scalable Fabrication of Single Silicon Vacancy Defect Arrays in Silicon Carbide Using Focused Ion Beam," *ACS Photonics*, 2017, vol. 4, pp. 1054-1059.
Benjamin D. Myers et al., "Directed assembly in epitaxial zinc oxide films on focused ion beam modified sapphire substrates," *Journal of Vacuum Science & Technology B*, Nanotechnology and Microelectronics: Materials, Processing, Measurement, and Phenomena, Jan./Feb. 2012, vol. 30, No. 1, pp. 010605-1-010605-5.
N. E. Sosa, C. Chen, J. Liu, T. J. Marks, M. C. Hersam, "Large-scale, nonsubtractive patterning of transparent conducting oxides by ion bombardment," *Applied Physics Letters*, 2011, vol. 99; pp. 022110-022110-3.
The International Search Report and the Written Opinion issued Jul. 21, 2020 for International Patent Application No. PCT/US19/60183; pp. 1-9.
Xumeng Zhang et al., "An artificial spiking afferent nerve based on Mott memristors for neurobotics," *Nature Communications*, (2020)11:51; pp. 1-10. https://doi.org/10.1038/s41467-019-13827-6.
Shin'ichi Asai et al., "High-Resistance Resistor Consisting of a Subthreshold CMOS Differential PAIR," *IEICE Trans. Electron.*, vol. E93-C, No. 6, Jun. 2010; pp. 741-746.
Schuman, Catherine D., et al. "A survey of neuromorphic computing and neural networks in hardware." *arXiv preprint arXiv*:1705.06963 (2017).

MEMRISTOR DEVICES EMBEDDED IN DIELECTRICS

CROSS-REFERENCE TO RELATED APPLICATIONS

The present application claims priority to U.S. provisional patent application no. 63/158,068 that was filed Mar. 8, 2021, the entire contents of which are incorporated herein by reference.

BACKGROUND

Memristors can be used in many systems including neuromorphic systems and memory systems. One major issue with the current memristor array technology is that the position of the memristor in a crossbar contact geometry is essentially random within an area defined by an overlying metal contact. In addition, the memristor layer must be thin, compared with the metal contact pitch, so that an initially large applied voltage can initiate the formation of the memristor under each crossing point. This approach leads to a high metal capacitance, and a low yield and uniformity of the memristors.

SUMMARY

The present disclosure provides memristor devices as well as methods for fabricating and using the memristor devices. The methods involve using ion implantation to introduce defects within a dielectric material at precisely located regions. The present approach enables making dense arrays of uniform memristors with a very low device capacitance, negligible power consumption, high reproducibility, and low noise. The present memristor devices, materials and methods are compatible with the conventional complementary metal oxide (CMOS) electronics as well as other electronic and optoelectronic platforms. Embodiments of the present memristor devices can function as a "nanosynaptic fabric," providing matrix multiplication functionality based on the resistivity of its individual programmable memristors.

In an embodiment, a memristor device comprises a top electrode; a bottom electrode; a dielectric material between the top and bottom electrodes; and an ion-implanted conductive region embedded within the dielectric material, the ion-implanted conductive region comprising the dielectric material. The ion-implanted conductive region forms an interface with the dielectric material such that a voltage applied across the top and bottom electrodes causes electrons to cross the interface as they move between the top and bottom electrodes so that the memristor device exhibits memristance.

Other principal features and advantages of the disclosure will become apparent to those skilled in the art upon review of the following drawings, the detailed description, and the appended claims.

BRIEF DESCRIPTION OF THE DRAWINGS

Illustrative embodiments of the disclosure will hereafter be described with reference to the accompanying drawings.

DETAILED DESCRIPTION

Figure 1A:
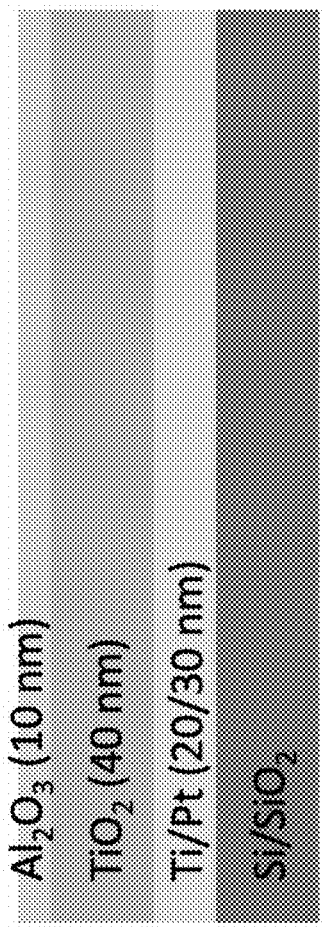
FIGS. 1A-1D illustrate the fabrication of a memristor device according to an illustrative embodiment. Details of the final memristor device are shown in FIG. 1D.
Figure 1B:
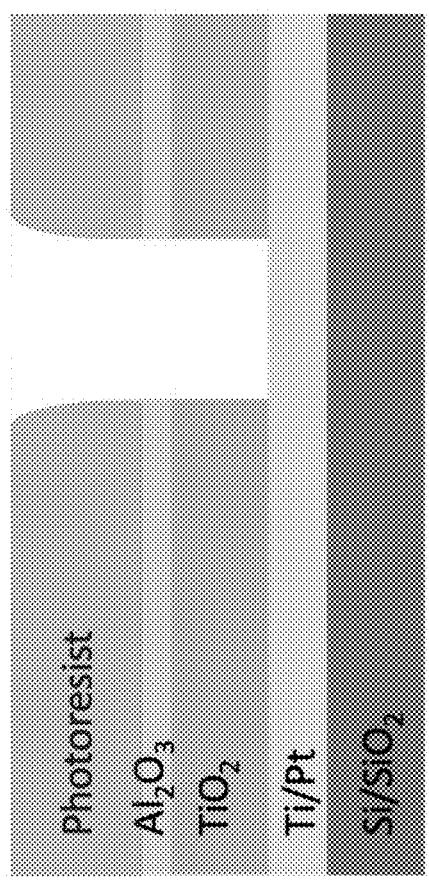
Figure 1C:
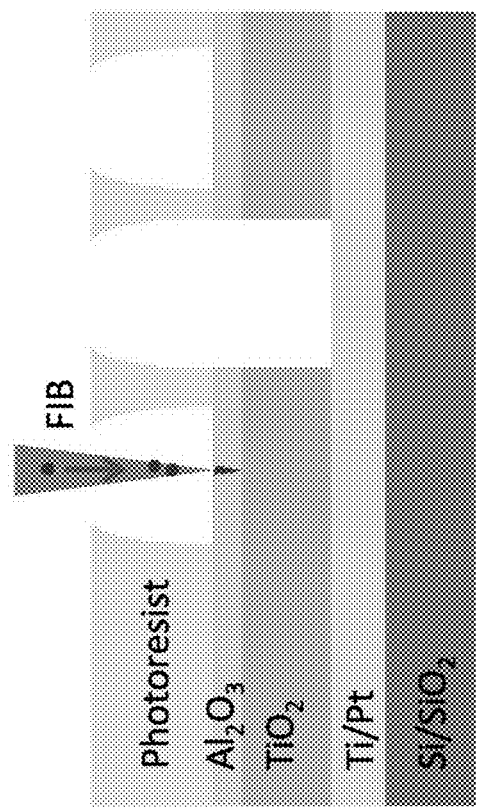
Figure 1D:
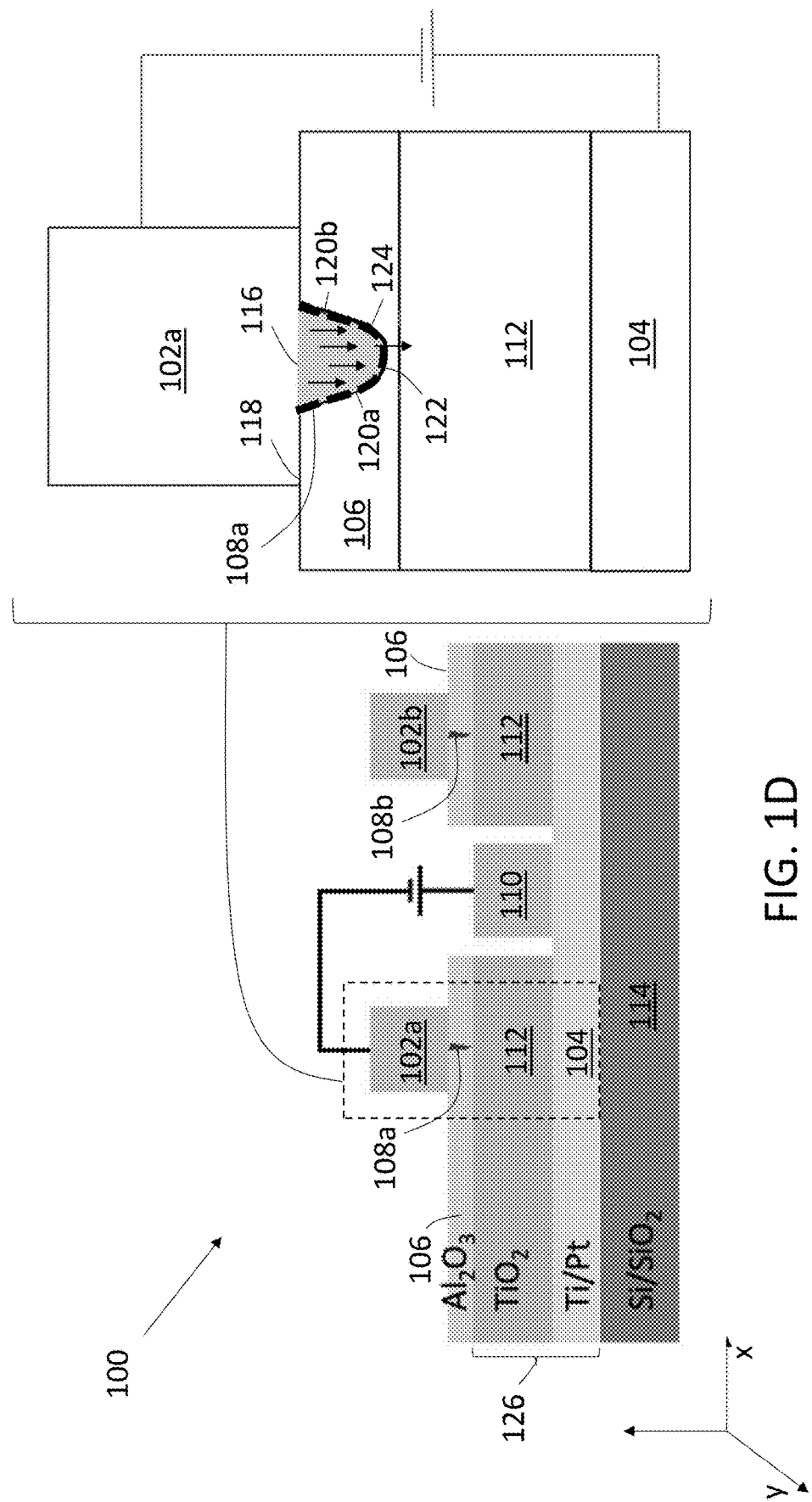

FIG. 1D depicts a schematic of a cross-section of memristor device 100 according to an illustrative embodiment. The device 100 comprises a top electrode 102a, a bottom electrode 104, and a dielectric material 106 between the top electrode 102a and the bottom electrode 104. The device 100 further comprises an ion-implanted conductive region 108a embedded within the dielectric material 106. A bottom electrode contact pad 110 allows for the top electrode 102a and the bottom electrode 104 to be operably connected so that a voltage may be applied across the two electrodes 102a, 104. The device 100 further comprises a second ion-implanted conductive region 108b, also embedded within the dielectric material 106 and positioned between a second top electrode 102b and the bottom electrode 104. The first and second ion-implanted conductive regions 108a, 108b may be members of an even larger array of ion-implanted conductive regions embedded within the dielectric material 106 of the device 100. Although not necessary in all embodiments, as shown in FIG. 1D, the present memristor devices may further comprise another dielectric material 112 between the top electrode 102a and the bottom electrode 104. Together, the dielectric material 106 and the dielectric material 112 form a dielectric stack 126 in the device 100. As indicated by the axes in FIG. 1D, the lateral dimensions in the device 100 are taken along the x and y axes and the vertical dimension is taken along the z axis. Layers of the device 100 are parallel to the xy plane. The cross-section shown in FIG. 1D is taken along the xz plane.

The right image shown in FIG. 1D is an expanded view of a section of the memristor device 100 that includes the ion-implanted conductive region 108a. The ion-implanted conductive region 108 has a top surface 116 that is in direct contact with the top electrode 102a. The top electrode 102a is also in direct contact with a top surface 118 of the dielectric material 106. The ion-implanted conductive region 108 is otherwise surrounded by, and in direct contact with, the dielectric material 106, at its side surfaces 120a, 120b, and its bottom surface 122. The interface 124 formed between the ion-implanted conductive region 108 and the dielectric material 106 is labeled and indicated with a black dashed line. As further described below, although the ion-implanted conductive region 108 may have various dimensions and overall shapes, its morphology is distinguished from that of a two-dimensional layer formed on top of an underlying material (e.g., the dielectric material 106). Specifically, by contrast to such a two-dimensional layer, the ion-implanted conductive region 108 has side surfaces 120a, 120b that extend between its top 116 and bottom 122 surfaces in the vertical direction. (As shown in FIG. 1D, this does not mean that the side surfaces 120a, 120b have to be oriented perfectly vertically.) Moreover, these side surfaces 120a, 120b form part of the interface 124 with the dielectric material 106 such that the interface 124 also extends in the vertical direction. Thus, the ion-implanted conductive region 108a is surrounded on all surfaces (other than its top surface 116) by the dielectric material 106, i.e., is embedded within the dielectric material 106. As such, the ion-implanted conductive region 108 is not in direct contact with the bottom electrode 104.

A voltage applied across the top 102a and bottom 104 electrodes causes electrons (depicted by arrows) to cross the interface 124 as they move from one of the electrodes 102a, 104 to the other (the actual direction depends upon the applied voltage bias). These electrons experience a change in resistance as they cross the interface 124 formed between the ion-implanted conductive region 108a (relatively low resistivity) and the surrounding dielectric material 106 (relatively high resistivity). In addition, and without wishing to be bound to any particular theory, the applied voltage and the resulting electrical current is thought to cause a change in the number and/or arrangement of the defects (e.g., oxygen vacancies) within the ion-implanted conductive region 108. Together, these features give rise to the memristance exhibited by the device 100. By "memristance" it is meant an electrical resistance that varies according to the history of electrical charge that has flowed through the device 100.

Other configurations of the present memristor devices (including device 100) may be used, provided the devices exhibit memristance. For example, as noted above, the ion-implanted conductive region 108a may have different dimensions and overall shapes as compared to those depicted in FIG. 1D. Illustrative dimensions and shapes are further described below. As another example, the ion-implanted conductive region 108a may extend further along the z axis towards the bottom electrode 104. In embodiments, the bottom surface 122 of the ion-implanted conductive region 108a extends through the dielectric material 106 to contact the underlying dielectric material 112. In such embodiments, the ion-implanted conductive region 108a forms an interface with the dielectric material 112 (along its bottom surface 122) in addition to the dielectric material 106 (along its side surfaces 120a, 120b). Such embodiments still result in an ion-implanted conductive region 108a embedded within a dielectric material (both the dielectric material 106 and the dielectric material 112) and thus, such embodiments will exhibit memristance.

As shown in FIG. 1D, the dielectric material 106 of the memristor device 100 may be in the form of a layer having lateral dimensions (dimensions measured along the x, y axes) which are significantly greater than its thickness (dimension measured along the z axis). Openings may be formed in the layer (as is the case in FIG. 1D) in order to allow for operable connection of the top electrode 102a and the bottom electrode 104. Because the dimensions of the ion-implanted conductive region 108a are controlled by the ion implantation process (further described below), the dielectric material 106 may be relatively thick as compared to existing memristor devices. This is useful for reducing the capacitance of the present memristor devices. In embodiments, the thickness of the dielectric material 106 is at least 5 nm, at least 10 nm, at least 20 nm, at least 50 nm, or in a range of from 5 nm to 100 nm, 10 nm to 100 nm, or 10 nm to 80 nm. Various thin layer fabrication techniques may be used to form the dielectric material 106 as a layer, e.g., plasma atomic layer deposition (ALD).

As shown in FIG. 1D, $Al_2O_3$ is used as the dielectric material 106. Other dielectric materials may be used, including those having a resistivity that is the same as, or greater than, bulk $Al_2O_3$ ($10^{16}$ Ω cm). The dielectric material may have a resistivity of at least $10^8$ Ω cm, at least $10^9$ Ω cm, at least $10^{10}$ Ω cm, at least $10^{11}$ Ω cm, at least $10^{12}$ Ω cm, at least $10^{13}$ Ω cm, at least $10^{14}$ Ω cm, or at least $10^{15}$ Ω cm. These resistivities refer to those measured at room temperature and using a standard electrical test station (e.g., Agilent 4285A LCR meter). Besides being insulating, suitable dielectric materials for the dielectric material 106 are also those capable of generating defects (e.g., oxygen vacancies) upon irradiation with ions as described further below. These defects enable electrical conduction within the irradiated region of the dielectric material 106, the number and/or arrangement of which may be changed upon application of a voltage across the device 100. Certain oxides may be used for the dielectric material 106. Suitable oxides include metal oxides such as $HfO_2$, $TiO_2$, $ZnO$, $SnO_2$, $SiO_2$, $Nb_2O_5$, $Ta_2O_5$, $MoO$, $WO$, $MnO$, $NiO$, and $CuO$. Mixed metal oxides may also be used, such as $ZnWO_x$ and $WSiO_x$. Perovskites may also be used, such as $SrTiO_3$, $Ba_{0.7}Sr_{0.3}TiO_3$, $SrZrO_3$, and $BiFeO_3$. Certain nitrides, e.g., SiN, and AlN, may also be used for the dielectric material 106.

The ion-implanted conductive region 108a is formed by irradiating a portion of the top surface 118 of the dielectric material 106 with ions. Thus, the ion-implanted conductive region 108a is composed of the dielectric material 106 as well as any ions that become implanted therein. The type of ions and their concentration depend upon the ion implantation process, which is further described below. Illustrative ions include H, Na, Cs, Mg, Ca, Sr, Ti, Nb, Ta, Cr, Mn, Fe, Ru, Co, Ni, Pd, Cu, Ag, Au, B, Al, Ga, In, C, Si, Sn, N, P, Bi, O, S, Ta, F, I, He, Ne, Ar, Kr, Xe, Eu, Er, Yb, and combinations thereof. In embodiments, the ions are different from the elements making up the dielectric material, although this is not necessary in all embodiments. In embodiments, the ions are distinct from elements making up the dielectric material as they may not form any covalent bonds with elements making up the dielectric material. The ions may be present in the ion-implanted conductive region 108a at an amount of from 1 fAμm$^2$ to 1 nAμm$^2$. As noted above, the ion implantation process induces defects within the dielectric material 106 (e.g., oxygen vacancies) that enable electrical conduction within the irradiated region of the dielectric material at a significantly lower resistance (higher conductivity) as compared to surrounding regions of the dielectric material 106 not irradiated with ions. As also noted above, the number and/or arrangement of the defects is also thought to change upon application of a voltage across the device 100.

The resistivity of the ion-implanted conductive region 108a may be characterized by its resistivity (or conductivity) as compared to the resistivity (or conductivity) of the surrounding regions of the dielectric material 106 not irradiated with ions. In embodiments, the resistivity (conductivity) of the ion-implanted conductive region 108a is at least $10^5$ less (greater) as compared to that of the surrounding dielectric material 106. This includes at least $10^6$, at least $10^7$, at least $10^8$, at least $10^9$, at least $10^{10}$, at least at least $10^{11}$, at least $10^{12}$, at least $10^{13}$, at least $10^{14}$, or at least at least $10^{15}$. Resistivities (conductivities) refer to those measured at room temperature and using a standard electrical test station (e.g., Agilent 4285A LCR meter).

As noted above, the dimensions and the overall shape of the ion-implanted conductive region 108a are controlled by the ion implantation process. The dimensions include the lateral dimensions (dimensions measured along the x, y axes) and a thickness (dimension measured along the z axis). The lateral dimensions may refer to the largest such values measured laterally across the ion-implanted conductive region 108a, i.e., as measured across its top surface 116. Similarly, the thickness of the ion-implanted conductive region 108a may refer to the largest such value measured vertically within the ion-implanted conductive region 108a. The lateral dimensions are smaller than that of the dielectric material 106, which may be in the form of a two-dimensional layer as described above. The lateral dimensions of the ion-implanted conductive region 108a may be the same or different and may each be no more than 100 µm, no more than 50 µm, no more than 25 µm, or no more than 10 µm. This includes a range of from 1 nm to 5 µm, from 10 nm to 10 µm, from 100 nm to 10 µm, from 500 nm to 5 µm, and from 1 µm to 5 µm. The thickness may be no more than 500 nm, no more than 100 nm, no more than 50 nm, no more than 20 nm, no more than 10 nm, or in a range of from 5 nm to 500 nm. In embodiments, if an underlying dielectric material 112 is used, the thickness of the ion-implanted conductive region 108a may be the same as the thickness of the dielectric material 106. Similarly, the ion-implanted conductive region 108a may assume various overall shapes. The three-dimensional shape corresponding to the cross-section shown in FIG. 1D is conical having a circular base at the top surface 116. However, other suitable shapes include pyramidal, cubical, cylindrical, etc.

As noted above, the ion-implanted conductive regions of the present memristor devices are formed using ion implantation. A variety of types of ion implantation techniques and systems may be used. The Example, below, demonstrates the use of a focused ion beam (FIB) technique and system to form the ion-implanted conductive region 108a in the device 100. However, ion implantation through physical masks may also be used. Parameters such as the ion source, ion energy, and ion dosage may be adjusted to achieve a desired conductivity for any ion-implanted conductive region. These parameters also affect the depth of the implanted ions and thus, the thickness of any ion-implanted conductive region. Lateral dimensions of any ion-implanted conductive region are controllable via spot size and scanning (if using a FIB) and mask configuration (if using masked ion implantation). Thus, the present methods allow for the ion-implanted conductive regions (and thus, the location of the memristor) to be precisely and consistently defined within the present memristor devices. (By "memristor" it is meant the physical region in the memristor device responsible for generating memristance.) This is by contrast to existing methods in which the lateral location of memristors is random within an area controllable only by the size and positioning of the electrode(s) in the memristor device.

Referring back to the memristor device 100 of FIG. 1D, the bottom electrode 104 may be in the form of a layer. The lateral dimensions and thickness of this layer are not particularly limited. Any conductive material may be used for the bottom electrode 104, such as metals (Ti, Ni, Au, Pt, combinations thereof) and semiconductors. Similarly, the morphology and dimensions of the top electrode 102a are not particularly limited. In fact, unlike existing memristor devices, the lateral dimensions of the top electrode 102a may be relatively large since the lateral dimensions of the ion-implanted conductive region 108a (and thus, the lateral location of the memristor) are fully defined by the ion implantation process. In embodiments, the lateral dimensions of the top electrode 102a may be the same or different and may each be at least 2 times, at least 5 times, at least 10 times, or at least 100 times greater than the corresponding lateral dimensions of the underlying ion-implanted region 108a. In other embodiments, however, the lateral dimensions of the top electrode 102a are the same as those of the corresponding lateral dimensions of the underlying ion-implanted region 108a. As shown in FIG. 1D, the bottom electrode 104 and the top electrode 102a are oppositely facing (by contrast to being positioned within the same plane). This results electron/defect movement generally in a direction perpendicular to the layers of the device 100 (i.e., along the z axis). This is by contrast to movement in a direction parallel to the layers of the device 100 (i.e., within an xy plane). However, other electrode configurations may be used, provided the desired memristance described herein is achieved. Various thin layer fabrication and lithographic patterning techniques may be used to form the electrodes 102a, 104, as well as the bottom electrode contact pad 110.

The dielectric material 112, if present, may be in the form of a layer. Openings may be formed in the layer (as is the case in FIG. 1D) in order to allow for operable connection of the top electrode 102a and the bottom electrode 104. The lateral dimensions of the layer are not particularly limited. Various thicknesses may also be used, including relatively thick layers to reduce capacitance. Any of the thicknesses described above for the dielectric material 106 may be used for the dielectric material 112. Any of the dielectric materials described above for the dielectric material 106 may be used for the dielectric material 112. However, desirably, the dielectric material 112 is one that facilitates formation of the defects in the selected dielectric material 106 upon ion implantation. As shown in FIG. 1D, the dielectric material 112 may have a different composition from the dielectric material 106. In other embodiments, however, the same composition may be used. Generally, the dielectric material 112 is in direct contact with the dielectric material 106 so as to form a continuous dielectric stack 126. The dielectric material 112 may be in direct contact with the bottom electrode 104. Various thin layer fabrication techniques may be used to form the dielectric material 112 as a layer.

As shown in FIG. 1D, the present memristor devices may be formed on an underlying substrate 114. Various materials may be used for the substrate 114, e.g., Si, $SiO_2$, and semiconductors.

As noted above, the present memristor devices may include an array of ion-implanted conductive regions, each ion-implanted conductive region embedded within a dielectric material (e.g., dielectric material 106, which may be in the form of a layer). Although ion-implanted conductive regions within the array may have similar dimensions, shapes, and conductivities, the flexibility of the present methods means that this is not necessary. That is, ion-implanted conductive regions may differ from one another by having different dimensions, different shapes, different conductivities, or combinations thereof.

The present disclosure also encompasses methods of fabricating the present memristor devices and methods of using the present memristor devices.

EXAMPLE

Introduction

Analog implementations of artificial neural networks closely mimic their biological counterparts and are proven to be much simpler and more efficient than the digital approaches. In most common implementations, the energy consumption of the artificial neural network based on memristor is inversely proportional to the memristor resistance. By contrast, using the approach described above and, in this Example, a dense array of memristors may be fabricated with a resistance around 10 GΩ. Producing such large resistors with small parasitic capacitances has proven to be a significant challenge. Native CMOS floating resistors are limited to very small Ohms-per-square (Ω/□) values and are not programmable in a static form. Several equivalent circuits have been proposed to produce large floating resistors in CMOS that are programmable, but they have very large footprints (1000s of $\mu m^2$), are highly non-linear, and are temperature sensitive. Memristor crossbar arrays present an attractive solution for neuromorphic computation. However, many memristors are incompatible with CMOS. Others use very thin dielectric layers that lead to a large parasitic capacitance per metal crossbar lines that consume a significant power. Thicker memristor material systems based on filamentation exist, but they show the quantum point-contact effect, limiting the maximum resistance to $h/2_q^2 \approx 13$ kΩ. This Example addresses these issues using robust and CMOS compatible $Al_2O_3$ and ion implantation. In addition to the high level of resistance exhibited by the fabricated memristors, the present approach reduces the parasitic capacitance of the crossbar (and hence the power loss) by at least 20 times as compared to the best conventional memristor devices.

Materials and Methods

FIGS. 1A-1D illustrate a process for fabricating a memristor device. As shown in FIG. 1A, a bottom electrode metal stack was first formed by depositing 20 nm Ti followed by 30 nm Pt on a $Si/SiO_2$ substrate (evaporation or plasma-enhanced atomic layer deposition (ALD) techniques may be used for the deposition). Subsequently, 40 nm of $TiO_2$ followed by 10 nm of $Al_2O_3$ was deposited using ALD, while avoiding exposure of the sample to ambient air. The top $Al_2O_3$ layer served a dual purpose. First, as dielectric barrier, in which conductive regions were patterned using a focused ion beam (FIB), and second, as chemical barrier to the diffusion of oxygen from ambient air into the underlying $TiO_2$ layer. As such, the sample is stable in ambient air after the $Al_2O_3$ layer is deposited.

As shown in FIG. 1B, a positive photoresist (e.g., AZ1813) was then applied and used as a mask for wet etching of the $Al_2O_3$ layer, followed by reactive ion etching (RIE) of the $TiO_2$ layer. This process was used to form an opening to make contact to the bottom electrode (Ti/Pt).

As shown in FIG. 1C, a negative photoresist was then patterned to define the top electrode pads. By using the etched features in the $Al_2O_3/TiO_2$ layer as alignment marks, the bottom electrode openings were also patterned. Focused ion beam (FIB) was then used to implant ions in the top layer of $Al_2O_3$ within the openings in the resist, with nanometer resolution and accurate control of the ion dose, thereby forming a conductive region embedded within the $Al_2O_3$ layer.

Finally, as shown in FIG. 1D, the top electrode metal stack of 20 nm Ti, 30 nm Ni, and 150 nm Au was evaporated and the remaining photoresist material lifted off. The memristor devices were tested by probing or wirebonding to the top and bottom electrode pads.

Figure 2A:
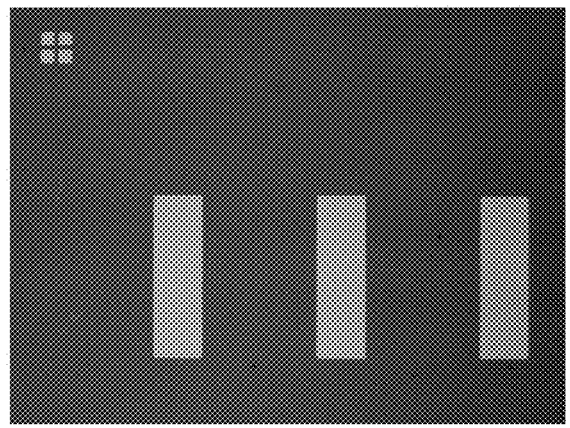
FIGS. 2A-2C show microscope images of the memristor device during fabrication, including after etching the bottom electrode openings as shown in FIG. 1B (FIG. 2A); after negative photoresist patterning for the top electrodes and bottom electrode contact pads and before focused ion beam (FIB) implantation as shown in FIG. 1C (FIG. 2B); and after FIB implantation and metal evaporation and lift off in FIG. 1D (FIG. 2C).
Figure 2B:
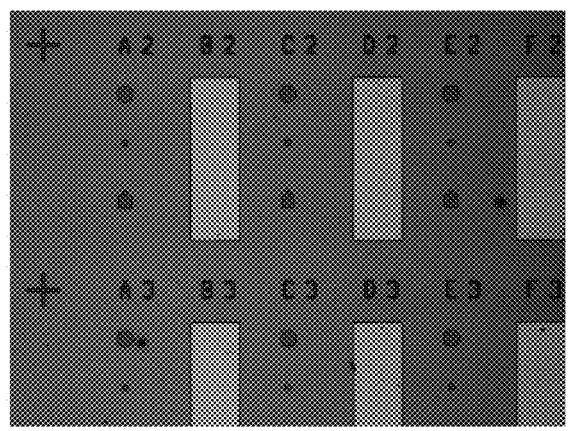
Figure 2C:
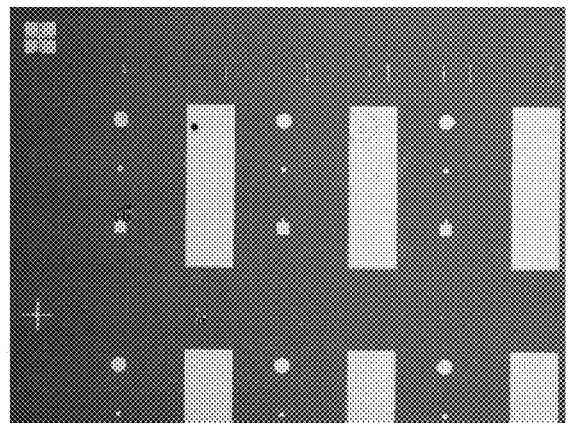

FIGS. 2A-2C show microscope images of the memristor device after etching the bottom electrode openings as shown in FIG. 1B (FIG. 2A); after negative photoresist patterning for the top and bottom electrode pads and before focused ion beam (FIB) implantation as shown in FIG. 1C (FIG. 2B); and after FIB implantation and metal evaporation and lift off in FIG. 1D (FIG. 2C).

Results

Figure 3:
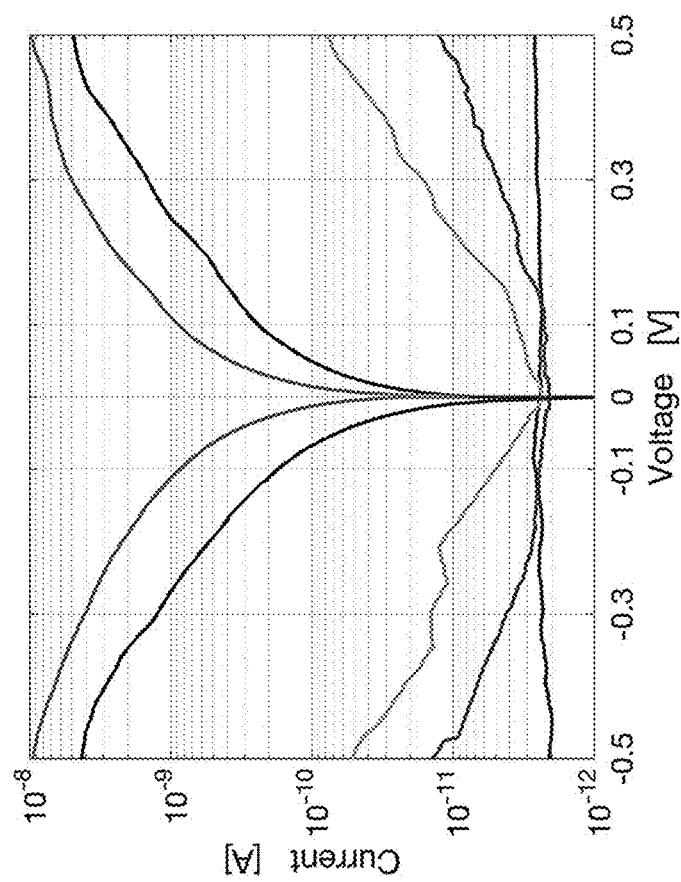
FIG. 3 shows the multi-level switching behavior for a fabricated memristor device having a 2 μm diameter ion-implanted conductive region embedded within a dielectric layer.

The fabricated memristor devices exhibited multi-level switching when operated between +0.5 V and −0.5 V at room temperature, with resistance levels varying between 100GΩ and 100 MΩ. The switching was performed with bias between 3 V and 6 V. The resistance level was affected by the implanted dose. FIG. 3 shows this multi-level switching behavior for a memristor device having a 2-μm diameter conductive region formed using an ion dose of 5 pA/$\mu m^2$.

Figure 4:
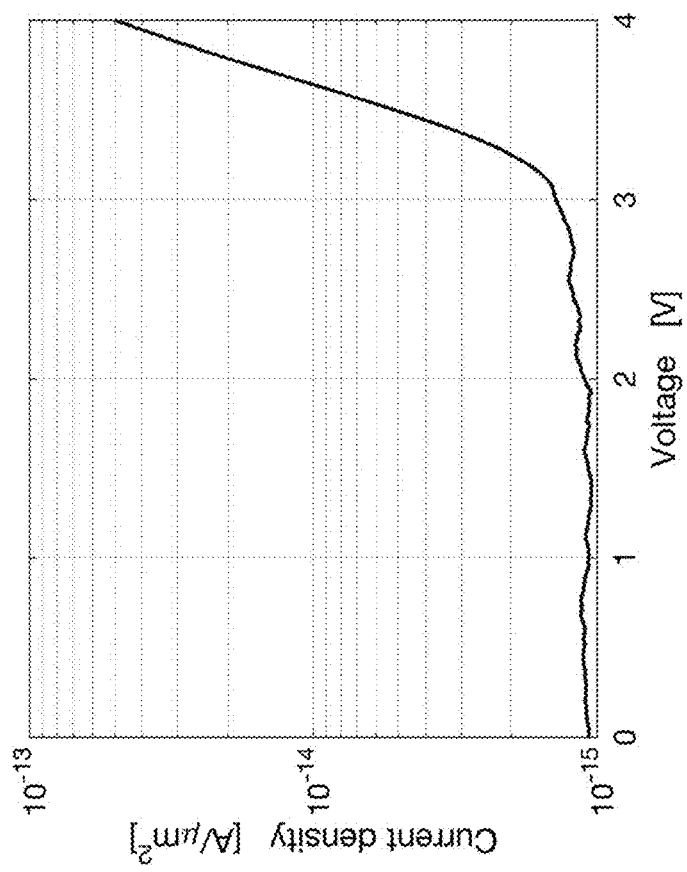
FIG. 4 shows the leakage current density of a control device (no ion-implanted conductive regions), showing low leakage up to 3 V.

Significantly, control devices without any ion implantation (no conductive regions formed) exhibited very low leakage current. For example, FIG. 4 shows the results for a control device pad of 50×50 μm, where leakage current density is below 2 fA/$\mu m^2$ up to 3V. The breakdown voltage for these devices typically exceeds 6 V.

Figure 5:
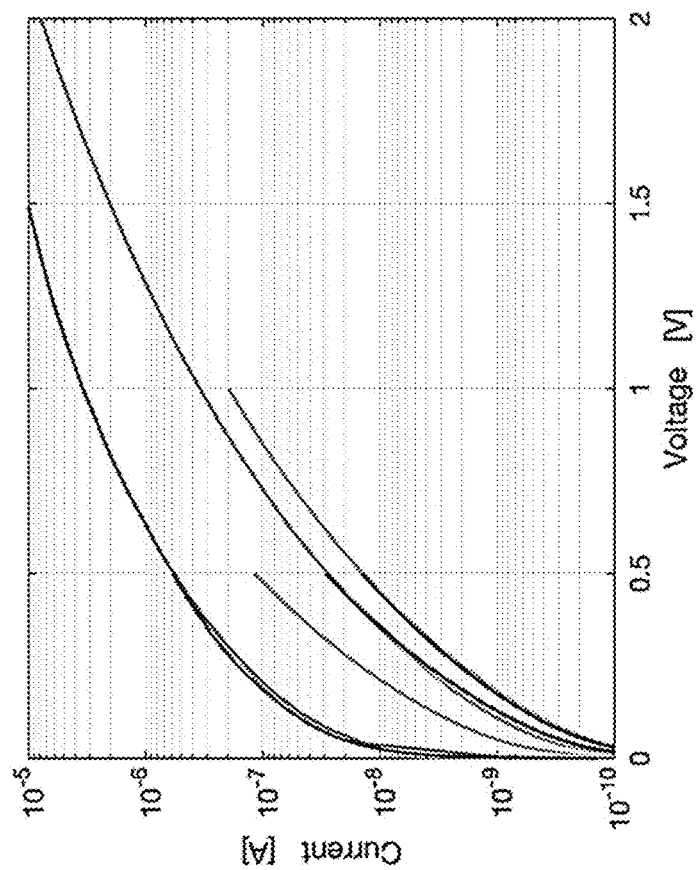
FIG. 5 shows a current-voltage curve for a fabricated memristor device, showing reliable switching between levels using a set voltage of ±3 V.

FIG. 5 shows that the fabricated memristor devices exhibit stable, low-noise I-V behavior and reliable switching between levels using a set voltage of ± 3V.

The results show that the present approach to memristor device fabrication may be extended to fabricate dense networks of memristors using grids of metal wires, where the location of the memristor is fully defined by ion-implantation with nanometer resolution so that the rest of the metal wire causes negligible leakage current, despite the large area (e.g., at least $10^3$ $\mu m^2$).

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more."

If not already included, all numeric values of parameters in the present disclosure are proceeded by the term "about" which means approximately. This encompasses those variations inherent to the measurement of the relevant parameter as understood by those of ordinary skill in the art. This also encompasses the exact value of the disclosed numeric value and values that round to the disclosed numeric value.

Unless otherwise indicated, the use of directional terms such as top, bottom, etc. are not necessarily intended to be limiting, but rather to provide a point of reference in the relevant structures.

The foregoing description of illustrative embodiments of the disclosure has been presented for purposes of illustration and of description. It is not intended to be exhaustive or to limit the disclosure to the precise form disclosed, and modifications and variations are possible in light of the above teachings or may be acquired from practice of the disclosure. The embodiments were chosen and described in order to explain the principles of the disclosure and as practical applications of the disclosure to enable one skilled in the art to utilize the disclosure in various embodiments and with various modifications as suited to the particular use contemplated. It is intended that the scope of the disclosure be defined by the claims appended hereto and their equivalents.

What is claimed is:

1. A memristor device comprising:
   a top electrode;
   a bottom electrode;
   a dielectric material between the top and bottom electrodes; and
   an ion-implanted conductive region embedded within the dielectric material, the ion-implanted conductive region comprising the dielectric material;

wherein the ion-implanted conductive region forms an interface with the dielectric material such that a voltage applied across the top and bottom electrodes causes electrons to cross the interface as they move between the top and bottom electrodes so that the memristor device exhibits memristance.

2. The memristor device of claim 1, wherein the ion-implanted conductive region comprises ions implanted therein.

3. The memristor device of claim 2, wherein the ions are present at an amount of from about 1 fA/$\mu m^2$ to about 1 nA/$\mu m^2$.

4. The memristor device of claim 1, wherein the ion-implanted conductive region has a resistivity that is at least $10^5$ times less than that of the dielectric material.

5. The memristor device of claim 1, wherein the ion-implanted conductive region has lateral dimensions, each of which is no more than about 100 $\mu$m, and a thickness of no more than about 100 nm.

6. The memristor device of claim 1, wherein the dielectric material has a resistivity that is the same as or greater than bulk $Al_2O_3$.

7. The memristor device of claim 1, wherein the dielectric material comprises $Al_2O_3$.

8. The memristor device of claim 1, further comprising second dielectric material between the top and bottom electrodes, the second dielectric material having a different composition than the dielectric material.

9. The memristor device of claim 8, wherein the dielectric material comprises $Al_2O_3$ and the second dielectric material comprises $TiO_2$.

10. The memristor device of claim 1, wherein the dielectric material is in the form of a layer.

11. The memristor device of claim 1, wherein the dielectric material is in the form of a bilayer of a first layer of a first dielectric material and a second layer of a second dielectric material.

12. The memristor device of claim 11, wherein the bilayer has a thickness of at least about 50 nm.

13. The memristor device of claim 11, wherein the first dielectric material comprises $Al_2O_3$ and the second dielectric material comprises $TiO_2$.

14. The memristor device of claim 1, wherein the top electrode has lateral dimensions which are at least 2 times greater than corresponding lateral dimensions of the ion-implanted conductive region.

15. The memristor device of claim 1, wherein the top and bottom electrodes are oppositely facing.

16. The memristor device of claim 1, wherein portions of the interface extend in a vertical direction, perpendicular to layers of the memristor device, between a top surface of the dielectric material and a bottom surface of the dielectric material.

17. The memristor device of claim 1, further comprising an array of ion-implanted conductive regions, the array comprising the ion-implanted conductive region.

18. A method of making the memristor device of claim 1, the method comprising forming the ion-implanted conductive region by irradiating a portion of a surface of the dielectric material with ions.

19. A method of using the memristor device of claim 1, the method comprising applying the voltage across the top and bottom electrodes.

20. A memristor device comprising:
an array of top electrodes;
a bottom electrode;
a layer of a dielectric material between the array of top electrodes and the bottom electrode; and
an array of ion-implanted conductive regions embedded within the layer of the dielectric material, each ion-implanted conductive region comprising the dielectric material;
wherein each ion-implanted conductive region forms an interface with the dielectric material such that a voltage applied across a corresponding top electrode of the array of top electrodes and the bottom electrode causes electrons to cross the interface as they move between the corresponding top electrode and the bottom electrode.

* * * * *